United States Patent
Smith et al.

(10) Patent No.: US 11,139,289 B2
(45) Date of Patent: Oct. 5, 2021

(54) CIRCUIT-PROTECTION DEVICES

(71) Applicant: MICRON TECHNOLOGY, INC., Boise, ID (US)

(72) Inventors: Michael A. Smith, Boise, ID (US); Kenneth W. Marr, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 143 days.

(21) Appl. No.: 16/543,724

(22) Filed: Aug. 19, 2019

(65) Prior Publication Data

US 2019/0371790 A1 Dec. 5, 2019

Related U.S. Application Data

(63) Continuation of application No. 15/892,625, filed on Feb. 9, 2018, now Pat. No. 10,431,577.

(Continued)

(51) Int. Cl.
*H01L 27/02* (2006.01)
*H01L 21/8234* (2006.01)
(Continued)

(52) U.S. Cl.
CPC .......... *H01L 27/0266* (2013.01); *G11C 16/22* (2013.01); *H01L 21/28035* (2013.01);
(Continued)

(58) Field of Classification Search
CPC .......... H01L 27/0266; H01L 21/28158; H01L 21/28035; H01L 27/11573; H01L 27/11526; H01L 29/0649; H01L 21/3212; H01L 21/823475; H01L 21/823462; H01L 21/823456; H01L 21/32137; H01L 21/31116; H01L 21/336; H01L 29/94; H01L 21/28238; H01L 27/105;
(Continued)

(56) References Cited

U.S. PATENT DOCUMENTS 4,916,333 A 4/1990 Kowalski
5,095,228 A 3/1992 Galbraith et al.
(Continued)

OTHER PUBLICATIONS

Mikhalev, V., et al., A Novel Depletion Mode High Voltage Isolation Device, IEEE Xplore Digital Library, Microelectronics and ElectronDevices (WMED), 2010 IEEE Workshop, Apr. 16, 2010, pp. 1-3.
(Continued)

*Primary Examiner* — Thanh T Nguyen
(74) *Attorney, Agent, or Firm* — Dicke, Billig & Czaja, PLLC

(57) ABSTRACT

Methods of forming a circuit-protection device include forming a dielectric having a first thickness and a second thickness greater than the first thickness over a semiconductor, forming a conductor over the dielectric, and patterning the conductor to retain a portion of the conductor over a portion of the dielectric having the second thickness, and to retain substantially no portion of the conductor over a portion of the dielectric having the first thickness, wherein the retained portion of the conductor defines a control gate of a field-effect transistor of the circuit-protection device, as well as apparatus having such circuit-protection devices.

20 Claims, 13 Drawing Sheets

Related U.S. Application Data

(60) Provisional application No. 62/611,874, filed on Dec. 29, 2017.

(51) Int. Cl.

| | | |
|---|---|---|
| *H01L 21/321* | (2006.01) | |
| *H01L 29/06* | (2006.01) | |
| *H01L 27/11526* | (2017.01) | |
| *H01L 27/11573* | (2017.01) | |
| *G11C 16/22* | (2006.01) | |
| *H01L 21/28* | (2006.01) | |
| H01L 21/3213 | (2006.01) | |
| G11C 16/14 | (2006.01) | |
| G11C 16/04 | (2006.01) | |
| G11C 16/10 | (2006.01) | |
| G11C 16/26 | (2006.01) | |
| H01L 21/311 | (2006.01) | |

(52) U.S. Cl.
CPC .... *H01L 21/28158* (2013.01); *H01L 21/3212* (2013.01); *H01L 21/823456* (2013.01); *H01L 21/823462* (2013.01); *H01L 21/823475* (2013.01); *H01L 27/11526* (2013.01); *H01L 27/11573* (2013.01); *H01L 29/0649* (2013.01); *G11C 16/0483* (2013.01); *G11C 16/10* (2013.01); *G11C 16/14* (2013.01); *G11C 16/26* (2013.01); *H01L 21/31116* (2013.01); *H01L 21/32137* (2013.01)

(58) Field of Classification Search
CPC .............. H01L 27/11568; H01L 21/022; H01L 21/0223; H01L 21/3144; G11C 16/22; G11C 16/26; G11C 16/10; G11C 16/0483; G11C 16/14; Y10S 438/981
See application file for complete search history.

(56) References Cited

U.S. PATENT DOCUMENTS

| | | |
|---|---|---|
| 5,446,303 A | 8/1995 | Quill et al. |
| 5,597,758 A | 1/1997 | Heim et al. |
| 5,641,697 A | 6/1997 | Iwanami |
| 5,714,784 A | 2/1998 | Ker et al. |
| 6,121,643 A | 9/2000 | Gardner et al. |
| 6,163,058 A | 12/2000 | Williamson et al. |
| 6,292,391 B1 | 9/2001 | Nojima |
| 6,432,618 B1 | 8/2002 | Hui et al. |
| 6,917,076 B2 | 7/2005 | Eguchi et al. |
| 7,078,286 B1 | 7/2006 | Mehta |
| 7,119,413 B2 | 10/2006 | Kutsukake et al. |
| 7,173,861 B2 | 2/2007 | Cho et al. |
| 7,230,299 B2 | 6/2007 | Robb et al. |
| 7,499,327 B2 | 3/2009 | Kwak et al. |
| 7,572,699 B2 | 8/2009 | Hong et al. |
| 8,766,365 B2 | 7/2014 | Smith |
| 2001/0049166 A1 | 12/2001 | Peschiaroli et al. |
| 2002/0056885 A1 | 5/2002 | Kita et al. |
| 2004/0057172 A1 | 3/2004 | Sun |
| 2005/0002141 A1 | 1/2005 | Reynders et al. |
| 2006/0003508 A1* | 1/2006 | Sakai ............ H01L 21/823864 438/197 |
| 2007/0063312 A1 | 3/2007 | Takemoto |
| 2007/0296020 A1* | 12/2007 | Shiba .................. H01L 27/0207 257/315 |
| 2008/0096350 A1 | 4/2008 | Lee et al. |
| 2008/0232009 A1 | 9/2008 | Ikegami |
| 2009/0194841 A1 | 8/2009 | Magome et al. |
| 2011/0063763 A1 | 3/2011 | Alvarez et al. |
| 2011/0127526 A1 | 6/2011 | Kawae et al. |
| 2011/0140227 A1 | 6/2011 | Smith et al. |
| 2011/0180867 A1 | 7/2011 | Tsang |
| 2011/0211390 A1* | 9/2011 | Hanzawa .............. H01L 45/141 365/163 |
| 2012/0007193 A1 | 1/2012 | Lee et al. |
| 2012/0094458 A1 | 4/2012 | Cai |
| 2012/0182654 A1 | 7/2012 | Wang et al. |
| 2013/0021840 A1* | 1/2013 | Tokita .................. G11C 11/412 365/156 |
| 2014/0138758 A1* | 5/2014 | Uozaki .............. H01L 27/1104 257/317 |
| 2015/0069524 A1 | 3/2015 | Hong et al. |
| 2017/0062624 A1* | 3/2017 | Makiyama .......... H01L 29/0649 |

OTHER PUBLICATIONS

M. Smith; "Circuit-Protection Devices and Apparatus Containing Circuit-Protection Devices," U.S. Appl. No. 15/687,732, filed Aug. 28, 2017; Total pp. 49.

\* cited by examiner

CIRCUIT-PROTECTION DEVICES

RELATED APPLICATIONS

This application is a Continuation of U.S. patent application Ser. No. 15/892,625, filed Feb. 9, 2018 and titled, "CIRCUIT-PROTECTION DEVICES," and claims the benefit of U.S. Provisional Patent Application Ser. No. 62/611,874, filed Dec. 29, 2017 and titled, "CIRCUIT-PROTECTION DEVICES," which are commonly assigned and incorporated by reference herein in their entirety.

TECHNICAL FIELD

The present disclosure relates generally to circuit protection, and, in particular, the present disclosure relates to circuit-protection devices, and methods of forming circuit-protection devices, e.g., in a memory.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices (e.g., NAND, NOR, etc.) have developed into a popular source of non-volatile memory for a wide range of electronic applications. Non-volatile memory is memory that can retain its data values for some extended period without the application of power. Flash memory devices typically use a one-transistor memory cell that allows for high memory densities, high reliability, and low power consumption. Changes in threshold voltage of the memory cells, through programming (which is sometimes referred to as writing) of charge-storage structures (e.g., floating gates or charge traps) or other physical phenomena (e.g., phase change or polarization), determine the data state (e.g., data value) of each memory cell. Common uses for flash memory and other non-volatile memory may include personal computers, personal digital assistants (PDAs), digital cameras, digital media players, digital recorders, games, appliances, vehicles, wireless devices, mobile telephones, and removable memory modules, and the uses for non-volatile memory continue to expand.

In a NOR flash architecture, a column of memory cells are connected in parallel with each memory cell connected to a data line, such as a bit line. A "column" refers to a group of memory cells that are commonly connected (e.g., selectively connected) to a local data line, such as a local bit line. It does not require any particular orientation or linear relationship, but instead refers to the logical relationship between memory cell and data line.

Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. A source select gate for a NAND string is connected to a source, while a drain select gate for a NAND string is connected to a data line, such as column bit line.

Data lines are sometimes connected to circuitry (e.g., peripheral circuitry) that may be configured to handle relatively low voltages (e.g., that may be referred to as low-voltage circuitry), such as data cache circuitry. The low-voltage circuitry may provide relatively low voltages (e.g., 0 (zero) V up to about 4 V) to the data lines during read or write operations. Peripheral circuitry generally includes active circuitry for access of the array of memory cells that is formed outside of an active area or areas on which the array of memory cells is formed.

However, during erase operations (e.g., involving NAND memory arrays), memory cells may be erased a block at a time by grounding all of the access lines in the block, for example, while allowing the data lines to float. A relatively high erase voltage (e.g., about 20 to 30 V) may then applied to a semiconductor on which the memory cells are formed, and thus to the channels of the memory cells, to remove the charge from charge-storage structures. This can cause the data lines to float to about the erase voltage and can damage low-voltage peripheral circuitry connected to the data lines.

Therefore, circuit-protection devices, such as field-effect transistors (FETs), may be connected between the data lines and the low-voltage circuitry for protecting the low-voltage circuitry from the relatively high voltages that may be present on the data lines during an erase operation. The circuit-protection devices may be connected (e.g., selectively connected) on a one-to-one basis to the data lines or one circuit-protection device to two or more data lines through a multiplexer. However, the pitch of the circuit-protection devices may be relatively large in order to avoid breakdown of the circuit-protection devices. For example, the relatively large pitch may occupy considerable area.

DETAILED DESCRIPTION

Figure 1:
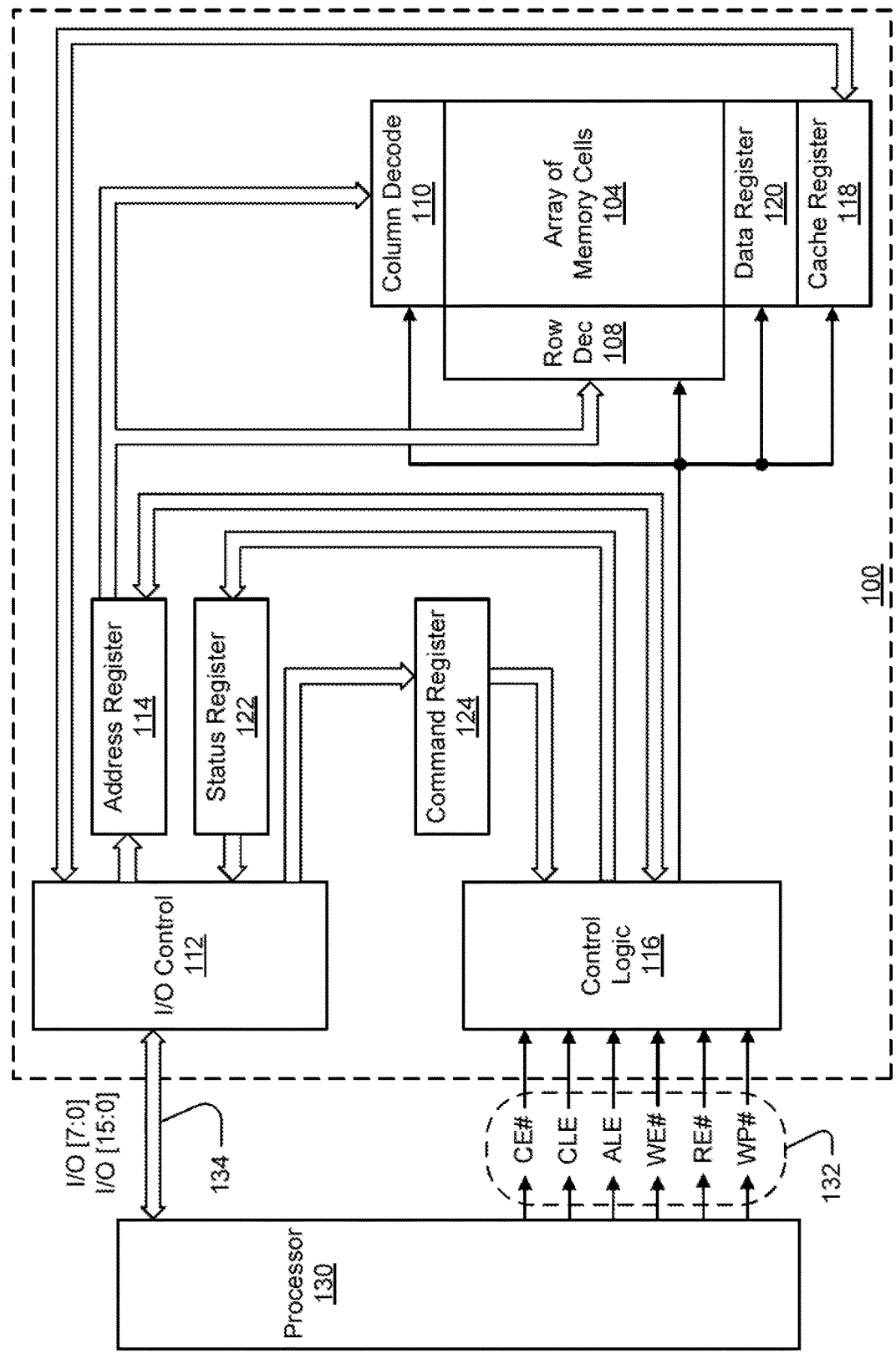
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting unless otherwise apparent from the context.

FIG. 1 is a simplified block diagram of a first apparatus (e.g., an integrated circuit device), in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, cellular telephones and the like. The processor 130, e.g., a controller external to the memory device 100, may be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and generates status information for the external processor 130, i.e., control logic 116 is configured to perform access operations (e.g., read operations, program operations and/or erase operations) on the array of memory cells 104. The control logic 116 is in communication with row decode circuitry 108 and column decode circuitry 110 to control the row decode circuitry 108 and column decode circuitry 110 in response to the addresses. Column decode circuitry 108 might include a circuit-protection device in accordance with an embodiment.

Control logic 116 may also be in communication with a cache register 118. Cache register 118 may latch data, either incoming or outgoing, as directed by control logic 116 to temporarily store data while the array of memory cells 104 is busy writing or reading, respectively, other data. During a program operation (e.g., write operation), data may be passed from the cache register 118 to data register 120 for transfer to the array of memory cells 104; then new data may be latched in the cache register 118 from the I/O control circuitry 112. During a read operation, data may be passed from the cache register 118 to the I/O control circuitry 112 for output to the external processor 130; then new data may be passed from the data register 120 to the cache register 118. The cache register 118 and/or the data register 120 may form (e.g., may form a portion of) a page buffer of the memory device 100. A page buffer may further include sensing devices (not shown) to sense a data state of a memory cell of the array of memory cells 104. A status register 122 is in communication with I/O control circuitry 112 and control logic 116 to latch the status information for output to the processor 130. The data register 120 and/or cache register 118 may include, or be connected to, a circuit-protection device in accordance with an embodiment.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands may be received over input/output (I/O) pins [7:0] of I/O bus 134 at I/O control circuitry 112 and may be written into command register 124. The addresses may be received over input/output (I/O) pins [7:0] of I/O bus 134 at I/O control circuitry 112 and may be written into address register 114. The data may be received over input/output (I/O) pins [7:0] for an 8-bit device or input/output (I/O) pins [15:0] for a 16-bit device at I/O control circuitry 112 and may be written into cache register 118. The data may be subsequently written into data register 120 for programming the array of memory cells 104. For another embodiment, cache register 118 may be omitted, and the data may be written directly into data register 120. Data may also be output over input/output (I/O) pins [7:0] for an 8-bit device or input/output (I/O) pins [15:0] for a 16-bit device. The I/O bus 134 might further include complementary data strobes DQS and DQSN that may provide a synchronous reference for data input and output. Although reference may be made to I/O pins, they may include any conductive node providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2A:
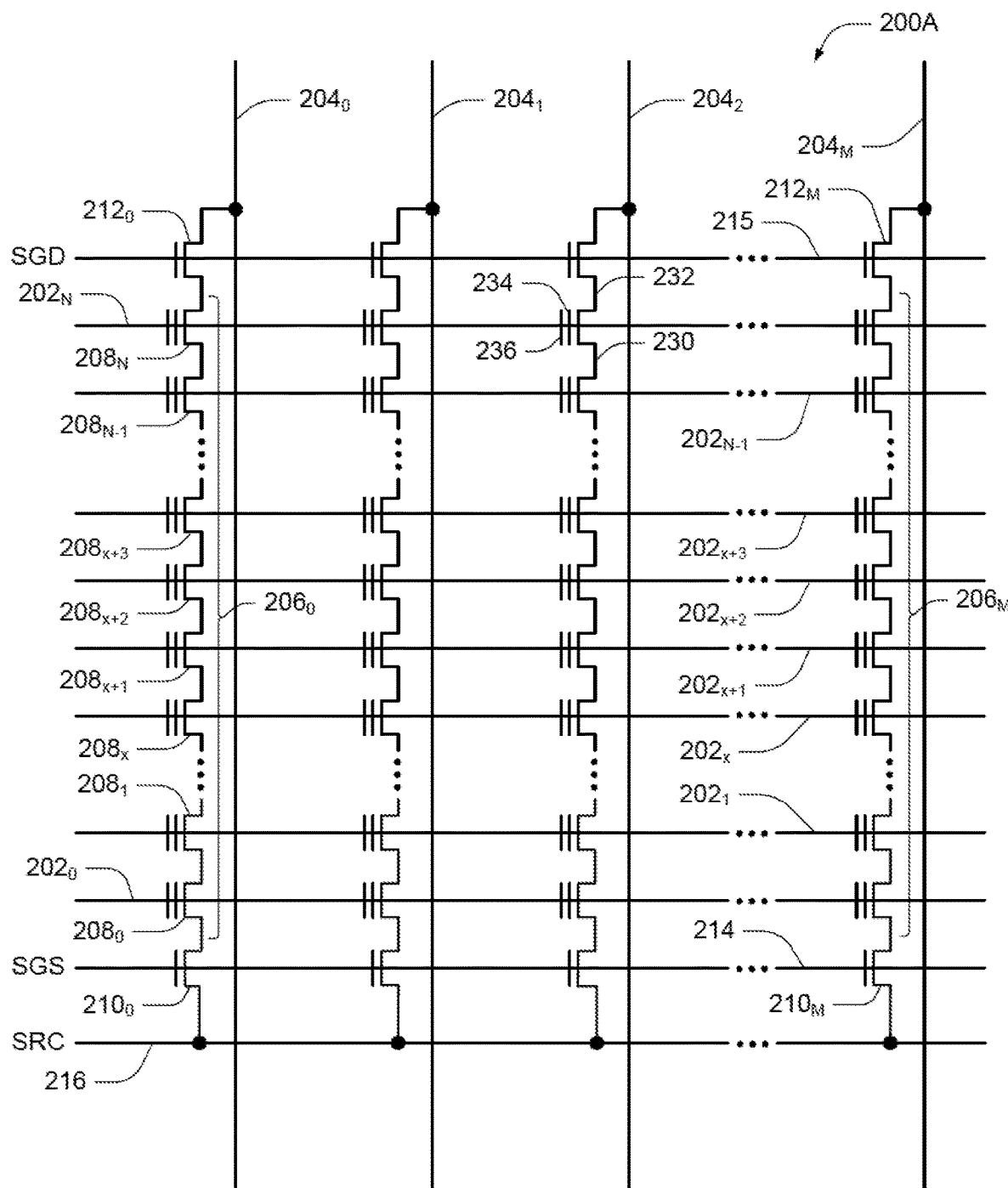
FIGS. 2A-2B are schematics of portions of an array of memory cells as could be used in a memory of the type described with reference to FIG. 1.

FIG. 2A is a schematic of a portion of an array of memory cells 200A as could be used in a memory of the type described with reference to FIG. 1, e.g., as a portion of array of memory cells 104. Memory array 200A includes access lines, such as word lines $202_0$ to $202_N$, and data lines, such as bit lines $204_0$ to $204_M$. The word lines 202 may be connected to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 may represent non-volatile memory cells for storage of data. The memory cells 208 of each NAND string 206 might be connected in series between a select gate 210 (e.g., a field-effect transistor), such as one of the select gates $210_0$ to $210_M$ (e.g., that may be source select transistors, commonly referred to as select gate source), and a select gate 212 (e.g., a field-effect transistor), such as one of the select gates $212_0$ to $212_M$ (e.g., that may be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 may utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding bit line 204. A control gate of each select gate 212 might be connected to select line 215.

The memory array in FIG. 2A might be a three-dimensional memory array, e.g., where NAND strings 206 may extend substantially perpendicular to a plane containing the common source 216 and to a plane containing a plurality of bit lines 204 that may be substantially parallel to the plane containing the common source 216.

Typical construction of memory cells 208 includes a data-storage structure 234 (e.g., a floating gate, charge trap, etc.) that can determine a data state of the memory cell (e.g., through changes in threshold voltage), and a control gate 236, as shown in FIG. 2A. The data-storage structure 234 may include both conductive and dielectric structures while the control gate 236 is generally formed of one or more conductive materials. In some cases, memory cells 208 may further have a defined source/drain (e.g., source) 230 and a defined source/drain (e.g., drain) 232. Memory cells 208 have their control gates 236 connected to (and in some cases form) a word line 202.

A column of the memory cells 208 may be a NAND string 206 or a plurality of NAND strings 206 selectively connected to a given bit line 204. A row of the memory cells 208 may be memory cells 208 commonly connected to a given word line 202. A row of memory cells 208 can, but need not, include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Figure 2B:
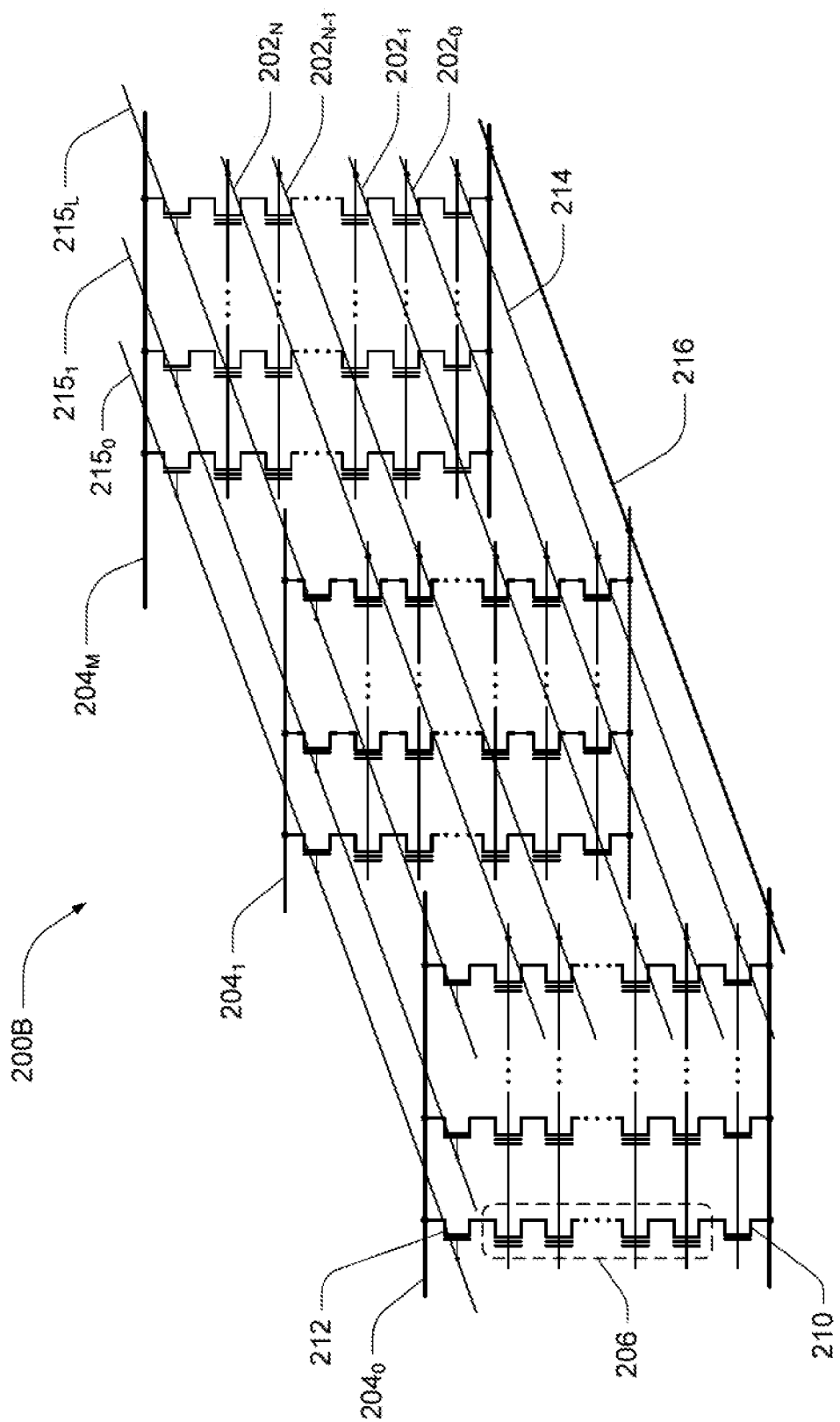

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_K$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

Although the examples of FIGS. 1, 2A and 2B were discussed in conjunction with NAND flash, the embodiments described herein are not limited to NAND flash, but can include other memory architectures, such as NOR flash, etc.

Circuit-protection devices, such as field-effect transistors, may be connected (e.g., selectively connected) between the data lines (e.g., bit lines) and peripheral circuitry, which is often low-voltage circuitry, such as the low-voltage circuitry of cache register 118 and/or the low-voltage circuitry of data register 120, to protect the peripheral circuitry from the relatively high voltages that may be present on the bit lines during an erase operation or other high-voltage memory access operation within the array of memory cells. For example, a field-effect transistor may be deactivated (e.g., turned off) during a high-voltage memory access operation to protect the low-voltage circuitry from the relatively high voltages that may be present on the bit lines, and on during a read or write operation, or other low-voltage memory access operation, to pass the relatively low voltages between the low-voltage circuitry and the bit lines.

Each circuit-protection device may be formed on an active region that is separated and electrically isolated from an adjacent active region, on which an adjacent circuit-protection device or other circuitry is formed, by an isolation region, such as a shallow-trench isolation (STI) region. A bit line may be connected to a high-voltage side of a circuit-protection device, and the low-voltage circuitry may be connected to a low-voltage side of a circuit-protection device. For example, for a field-effect transistor, a contact (e.g., that may be referred to as a high-voltage-side contact) may couple a bit line to a source/drain region on the high-voltage side, and a contact (e.g., that may be referred to as a low-voltage-side contact) may couple low-voltage circuitry to a source/drain region on the low-voltage side. However, the pitch of the field-effect transistors may be relatively large, owing to the relatively large distance between the high-voltage-side contact and the edges of the active region on the high-voltage side that may be needed to avoid breakdown during an erase operation. Note that, as described herein, "high-voltage" and "low-voltage" refer only to relative values of voltage level, and do not require specific levels or polarities of voltage between the high-voltage and low-voltage sides of the circuit protection device, nor do they require a specific difference in voltage levels.

Figure 3:
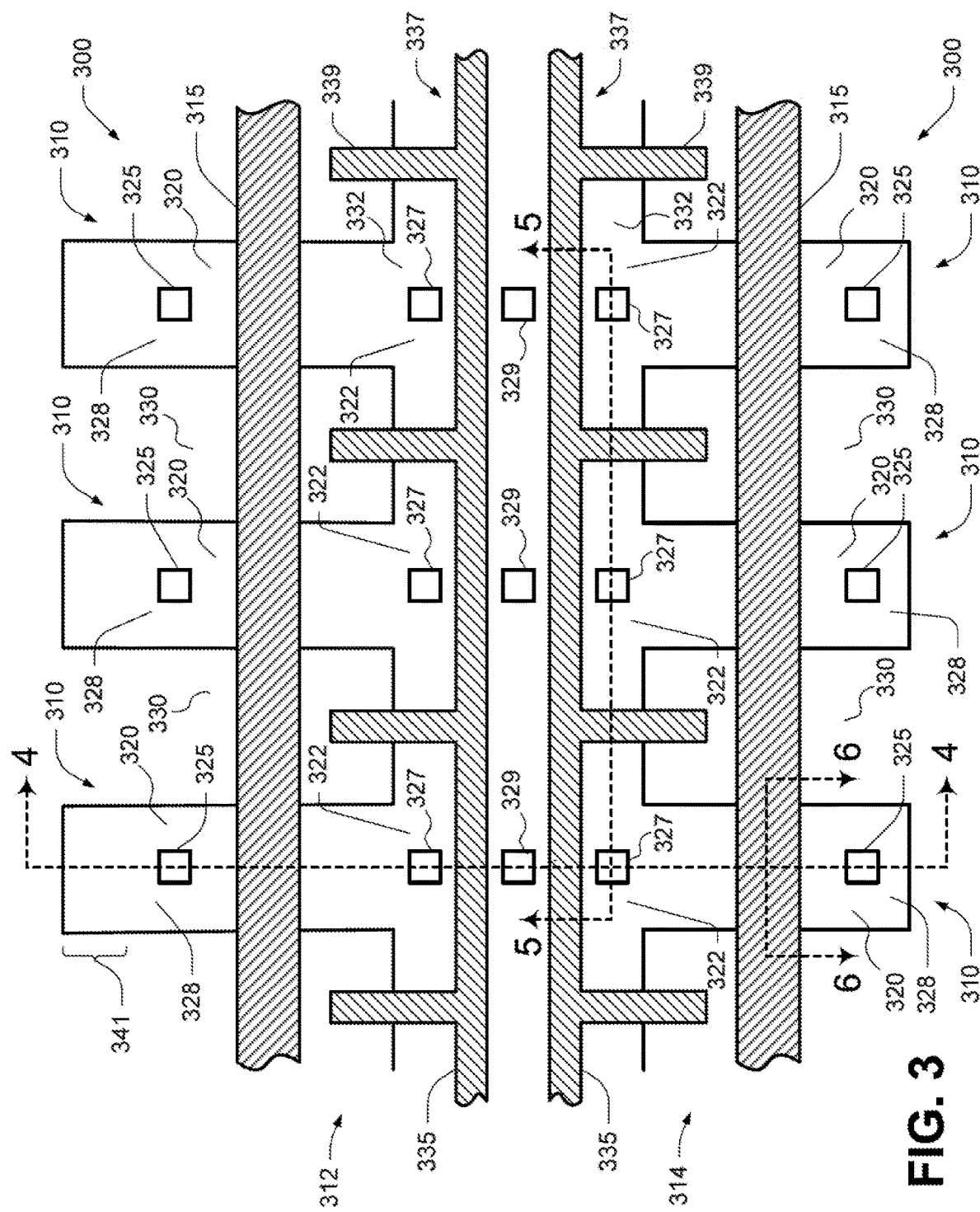
FIG. 3 is a top plan view of a circuit-protection device, according to another embodiment.

FIG. 3 is a top plan view of a circuit-protection device 300, e.g., that may also be referred to as a high-voltage isolation device. Circuit-protection device 300 may include a plurality of circuit-protection (e.g., high-voltage isolation) units 310. For example, circuit-protection device 300 may include a row 312 of circuit-protection units 310 and a row 314 of circuit-protection units 310. A row 312 of circuit-protection units 310 are those circuit-protection units 310 commonly coupled to a control line 315 and a row 314 of circuit-protection units 310 are those circuit-protection units 310 commonly coupled to another control line 315.

Each circuit-protection unit 310 may include a side (e.g., low-voltage side) that may include a node 320 (e.g., a low-voltage node) that may be connected to low-voltage circuitry, such as data cache 118 and/or data register 120 (FIG. 1). Each circuit-protection unit 310 may further include a side (e.g., high-voltage side, such as a bit-line side) that may include a node 322 (e.g., a high-voltage node) that may be connected to circuitry that can be at a relatively high voltage (e.g., about 20V to about 30V) or a relatively low voltage (e.g., about zero volts (0V) to about 4V), such as a bit line 204 (FIG. 2). For example, a node 320 may include a contact 325 that may be connected (e.g., selectively connected) to low-voltage peripheral circuitry and a node 322 may include a contact 327 that may be connected (e.g., selectively connected) to a bit line. Each circuit-protection unit 310 may selectively connect a node 320 to a node 322.

Nodes 320 may be respectively formed in individual active regions 328 that are defined in a semiconductor by isolation regions 330, e.g., STI regions, formed in the semiconductor on either side of a given individual active region 328. In other words, an isolation region 330 is between adjacent active regions 328, respectively corresponding to adjacent nodes 320 of adjacent circuit-protection units 310 in each of rows 312 and 314. Each isolation region 330 electrically isolates and physically separates its adjacent active regions 328, and thus adjacent nodes 320, from each other. The semiconductor may be comprised of silicon, e.g., monocrystalline silicon, and, for example, may be conductively doped to have a conductivity type, e.g., a p-type conductivity, e.g., to form a p-well.

Nodes 322 of the circuit-protection units 310 of rows 312 and 314 are formed in a single (e.g., in a common) active region 332. That is, nodes 322 are not electrically isolated from or physically separated from each other by isolation regions formed in the semiconductor. Instead, nodes 322 of a row 312 or 314 may be selectively connected to each other by a gate 335 (e.g., that may be referred to as an isolation gate) formed over active region 332. Active regions 328 may be contiguous with active region 332. That is, active regions 328 may extend from active region 332, as shown in FIG. 3.

For example, when nodes 322 are at relatively high voltages (about 20V to 30V), e.g., during an erase operation, gate 335 may be selectively allowed to float or a relatively high voltage may be selectively applied to gate 335 so that the nodes 322 are electrically connected. That is, gate 335 may be activated (e.g., turned on) to electrically connect nodes 322. Activating (e.g., turning on) the gate 335 may further electrically connect the nodes 322 to the contacts 329. During an erase operation, the bit lines, and thus the nodes 322 connected to the bit lines, may be at about the erase voltage concurrently and thus there is no need to electrically isolate nodes 322 from each other.

When nodes 322 are at relatively high voltages, circuit-protection units 310 may act to prevent the relatively high voltages from being passed to nodes 320 and thus to the low-voltage circuitry connected to nodes 320. In other words, when nodes 322 are at relatively high voltages, circuit-protection units 310 may electrically isolate nodes 322, and thus the bit lines, from nodes 320, and thus the low-voltage circuitry. For example, circuit-protection units 310 may be deactivated (e.g., turned off) to electrically isolate nodes 322 from nodes 320.

However, when nodes 322 are at relatively low voltages (about 0V to 4V), e.g., during a read or write operation, gate 335 may be selectively grounded so that the nodes 322 are electrically isolated from each other. That is, gate 335 may be deactivated (e.g., turned off) to electrically isolate nodes 322. When nodes 322 are at relatively low voltages turning gate 335 off, e.g., by grounding gate 335, may provide sufficient isolation between nodes 322. This may avoid the need to form isolation (e.g., STI) regions in the semiconductor to create separate active regions with the isolation regions therebetween so that each active region includes one node 322. Forming isolation regions in the semiconductor to form separate active regions so that each active region includes one node 322 can increase the distance between adjacent nodes, and thus the pitch of circuit-protection units 310, as compared to when multiple nodes 322 are formed on a single active region with gate 335 between adjacent nodes.

For example, during a read or a write operation, a circuit-protection unit 310 may be activated (e.g., turned on) when the node 322 connected thereto is at a low voltage and when adjacent nodes 322 (e.g., vertically, horizontally, and/or diagonally in FIG. 3) are connected to circuit-protection units 310 that are deactivated (e.g., off). In such an example, deactivating (e.g., turning off) gate 335 acts to electrically isolate the node 322 connected to the circuit-protection unit 310 that is activated (e.g., on) from the adjacent nodes 322 connected to circuit-protection units 310 that are deactivated (e.g., off). As such, deactivating (e.g., turning off) gate 335 acts to electrically isolate adjacent nodes 322 that may be at different voltages. Deactivating (e.g., turning off) gate 335 may further electrically isolate the nodes 322 from the contacts 329. Note that portions of gate 335 may surround at least a portion of each node 322. That is, the portions of gate 335 may define nodes 322.

A circuit-protection unit 310, e.g., of a row 312, may include an extension region 341. The extension region 341 may represent an area of the node 320 of the circuit-protection unit 310 of row 312 that may not be relevant to the operation of the circuit-protection device 300, and that may not be contained in the opposing circuit-protection unit 310 of row 314. The purpose of the extension region 341 will be discussed with reference to FIGS. 7A-7L. Although the extension regions 341 are depicted to be formed for only the row 312 of the circuit-protection device 300, extensions regions 341 could be utilized with both rows 312 and 314 of the circuit-protection device 300.

Figure 4:
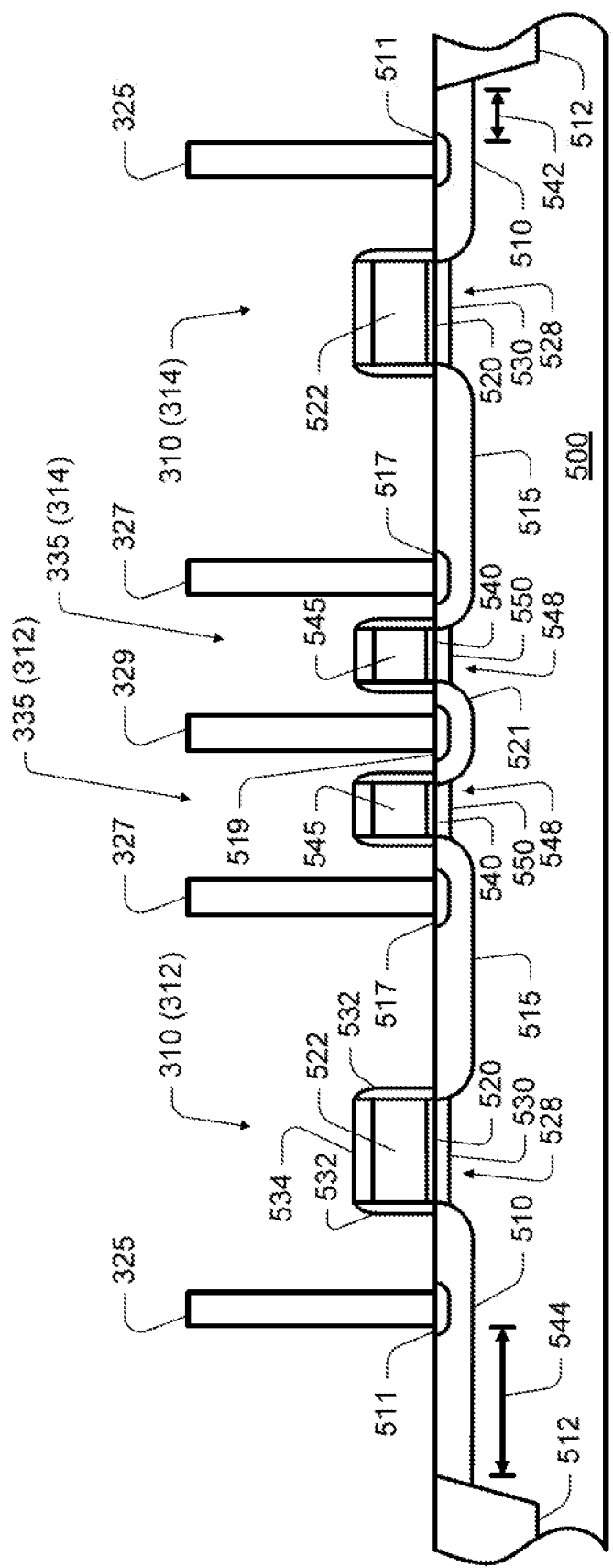
FIG. 4 illustrates a cross section taken along line 4-4 in FIG. 3.
Figure 5:
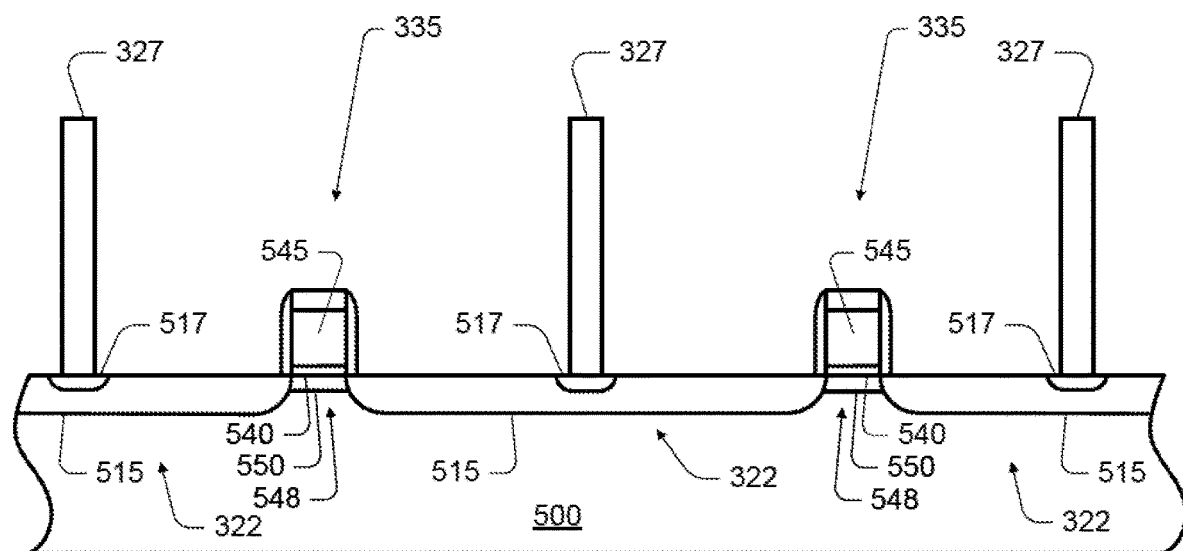
FIG. 5 illustrates a cross-section taken along line 5-5 in FIG. 3.
Figure 6:
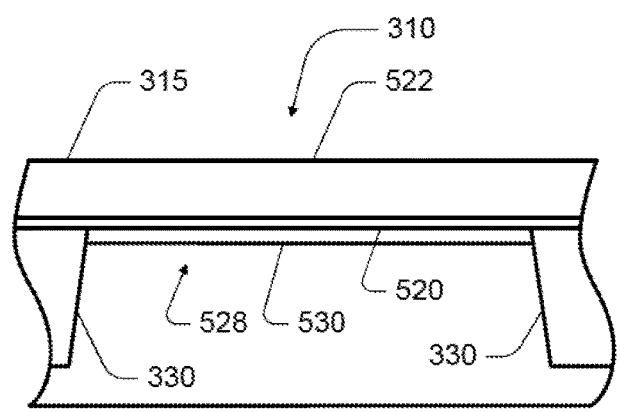
FIG. 6 illustrates a cross-section taken along line 6-6 of FIG. 3.

FIG. 4 illustrates a cross-section taken along line 4-4 in FIG. 3. FIG. 5 illustrates a cross-section taken along line 5-5 of FIG. 3. That is, FIG. 5 illustrates a portion of the high-voltage (e.g., bit-line) side of circuit-protection device 300, and thus a portion of the single active region 332, by spanning a plurality of nodes 322 and illustrating a gate (e.g., field-effect transistor) 335 between adjacent nodes 322. FIG. 6 illustrates a cross section taken along line 6-6 in FIG. 3, and thus illustrates the low-voltage side of a circuit-protection unit 310 and an active region 328. FIGS. 4-6 will now be discussed concurrently.

For some embodiments, each circuit-protection unit 310 may be a field-effect transistor 310, as shown in FIGS. 4 and 6. FIG. 4 illustrates a field-effect transistor 310 from row 312 and a field-effect transistor 310 from row 314, as indicated in parentheses in FIG. 4. Each field-effect transistor 310 may be formed over a semiconductor 500 that may be comprised of silicon, e.g., monocrystalline silicon, or other semiconductor material and, for example, may be conductively doped to have p-type conductivity, e.g., to form a p-well.

Each field-effect transistor 310 may include a source/drain 510 that corresponds to a node 320. Source/drains 510 may have a conductivity type different from (e.g., opposite of) the conductivity type of the semiconductor 500. For example, source/drains 510 may have an n-type conductivity, e.g., an $n^-$ or $n^+$ conductivity type, for some embodiments. An optional region 511 within (e.g., that forms a portion of) a source/drain 510 may have the conductivity type of the source/drain 510 at a different (e.g., higher) conductivity and may be connected to a contact 325. That is, regions 511 may be doped to a higher conductivity levels than source/drains 510. Source/drains 510 may be connected to low-voltage circuitry, such as data cache 118 and/or data register 120 through a contact 325.

Source/drains 510 may be adjacent to (e.g., may abut) isolation (e.g., STI) regions 512 in semiconductor 500. The isolation regions 512 may be formed of a dielectric material. One source/drain 510 might extend a first distance 542 from its corresponding contact 325 to its corresponding isolation region 512, while the other source/drain 510 might extend a second distance 544, greater than the first distance 542, from its corresponding contact 325 to its corresponding isolation region 512. For some embodiments, the distance 544, including the extension 341, may be greater than two times the distance 542. For further embodiments, the distance 544 may be greater than three times the distance 542. The isolation regions 330 in FIGS. 3 and 6 may be contiguous with isolation regions 512. Note that the isolation regions 330 may define the active region 328 therebetween, as shown in FIG. 6.

The field-effect transistors 310 that form row 312 may have a source/drain 515 that is connected to (e.g., merges with) a source/drain region of a first gate 335 from row 312 that may be configured as a field-effect transistor 335. The field-effect transistors 310 that form row 314 may have a source/drain 515 that is connected to (e.g., merges with) a source/drain region of a second gate 335 from row 314 that may be configured as a field-effect transistor 335.

Source/drains 515 may have the conductivity type of the source/drains 510, e.g., an $n^-$ conductivity type, for some embodiments. An optional region 517 within (e.g., that forms a portion of) a source/drain 515 may have the conductivity type and level of the regions 511, e.g., an $n^+$ conductivity type, and may be connected to a contact 327, as shown in FIGS. 4 and 5. That is, regions 517 may be doped to a higher conductivity levels than source/drain 515. Therefore, source/drains 515 may be connected to bit lines 204 through contacts 327.

The field-effect transistors 310 may include a gate dielectric (e.g., a gate oxide) 520 over semiconductor 500 and a control gate 522 over gate dielectric 520, as shown in FIGS. 4 and 6. A control gate 522 may be connected to or form a portion of a control line 315 (FIGS. 3 and 6). A control gate 522, and thus a control line 315, may comprise, consist of, or consist essentially of conductively doped polysilicon and/or may comprise, consist of, or consist essentially of metal, such as a refractory metal, or a metal-containing material, such as a refractory metal silicide or a metal nitride, e.g., a refractory metal nitride, as well as any other conductive material. As is common in semiconductor device fabrication, the field-effect transistors 310 may include dielectric sidewall spacers 532 and a dielectric cap 534.

A channel 528 of a field-effect transistor 310 may be between a source/drain 510 and a source/drain 515, as shown in FIG. 4. In other words, during operation of a field-effect transistor 310, a channel 528 can be formed.

A portion of channel 528 may have the conductivity type of the semiconductor 500 at a different (e.g., higher) conductivity. For example, a portion of channel 528 may be doped to have p-type conductivity, where the doped portion may be referred to as a threshold voltage (Vt) implant 530, as shown in FIGS. 4 and 6. For example, channel 528 may be lightly doped to have p-type conductivity so that the corresponding field-effect transistor 310 has a desired threshold voltage.

When a relatively high voltage is applied to a contact 327, and thus a source/drain 510, such as when array of memory cells 104 is erased, field-effect transistor 310 may be selectively deactivated (e.g., turned off) so as to protect (e.g., electrically isolate) the low-voltage circuitry connected to a contact 325, and thus a source/drain 510, from the relatively high voltage. In other words, field-effect transistor 310 can electrically isolate source/drain 510, and thus node 320, from source/drain 515, and thus node 322, when the relatively high voltage is applied to source/drain 515.

When a relatively low voltage is applied to a contact 327, and thus a source/drain 515, such as when array of memory cells 104 is being read or written to, field-effect transistor 310 may be selectively activated (e.g., turned on) so as to allow the relatively low voltage to be applied to the low-voltage circuitry connected to a contact 325, and thus a source/drain 510. In other words, field-effect transistor 310 can electrically connect source/drain 510, and thus node 320, to source/drain 515, and thus node 322, when the relatively low voltage is applied to source/drain 515. Note that field-effect transistor 310 may be said to selectively connect a node 320 to a node 322.

The field-effect transistors 335 may include a gate dielectric (e.g., a gate oxide) 540 over semiconductor 500 and a control gate 545 over gate dielectric 540, as shown in FIGS. 4 and 5. The gate dielectric 540 of the field-effect transistors 335 may be thinner than the gate dielectric 520 of the field-effect transistors 310. As an example, the gate dielectric 540 may have a thickness of about 68 Å while the gate dielectric 520 may have a thickness of about 400 Å. A control gate 545 may be connected to or form a portion of a control line 337 (FIG. 3). Control gate 545, and thus a control line 337, may comprise, consist of, or consist essentially of conductively doped polysilicon and/or may comprise, consist of, or consist essentially of metal, such as a refractory metal, or a metal-containing material, such as a refractory metal silicide or a metal nitride, e.g., a refractory metal nitride, as well as any other conductive material. The control line 337, and thus field-effect transistors 335, may include spurs 339 extending between contacts 327. The spurs 339 may further extend over portions of the isolation regions 330. Although not shown in FIG. 3, the control lines 337 for both rows 312 and 314 may be electrically connected. In the same manner as discussed with respect to field-effect transistors 310, field-effect transistors 335 may also include dielectric spacers and cap.

The field-effect transistor 335 from row 312 may have a source/drain 521 that is connected to (e.g., merges with) a source/drain region of a field-effect transistor 335 from row 314. The source/drain 521 may have the conductivity type and level of the source/drains 510, e.g., an n⁻ conductivity type, for some embodiments. An optional region 519 within (e.g., that forms a portion of) the source/drain 521 may have the conductivity type and level of the regions 511 and 517, e.g., an n⁺ conductivity type, and may be connected to a contact 329, as shown in FIG. 4. That is, region 519 may be doped to a higher conductivity levels than source/drain 521. Source/drain 521 may be connected to a source (e.g., source 216 of FIGS. 2A-2B) through contact 329.

A channel 548 of a field-effect transistor 335 may be between a source/drain 515 and source/drain 521. In other words, during operation of a field-effect transistor 335, a channel 548 can be formed. A portion of channel 548 may have the conductivity type of the semiconductor 500 at a different (e.g., higher) conductivity. For example, a portion of channel 548 may be doped to have p-type conductivity, where the doped portion may be referred to as a threshold voltage (Vt) implant 550, as shown in FIGS. 4 and 5. For example, channel 548 may be lightly doped to have p-type conductivity so that the field-effect transistor 335 has a desired threshold voltage.

FIG. 5 shows that portions of field-effect transistors 335 are between nodes 322, and thus define nodes 322, on active region 332 on the high-voltage side of circuit-protection device 300. However, on the low-voltage side of circuit-protection device 300, isolation regions 330 formed in semiconductor 500 separate and electrically isolate individual active regions 328 from each other and thus define the individual active regions 328. Note that each active region 328 may include a source/drain 510 and a contact 325. Note that isolation regions 330 may extend into semiconductor 500 below an upper surface of semiconductor 500 and thus below upper surfaces of active regions 328, as shown in FIG. 6.

Nodes 322 of adjacent circuit-protection units 310 in a single row of circuit-protection units 310 may respectively correspond to the source/drains 515 of field-effect transistor 335. That is, one of the source/drains 515 of field-effect transistor 335 may correspond to a node 322 of a circuit-protection unit 310 and the other source/drain 515 of field-effect transistor 335 may correspond to a node 322 of an adjacent circuit-protection unit 310 in the same row of circuit-protection units 310, as shown in FIG. 5. Note that a row of circuit-protection units 310 are commonly connected to a control line 315, as shown in FIG. 3 for rows 312 and 314. Note further that a node 322 of a circuit-protection unit 310 may include a first source/drain of field-effect transistor 335 and a node 322 of an adjacent circuit-protection unit 310 in the same row (FIG. 5) or in a different row (FIG. 4) may include a second source/drain of field-effect transistor 335.

When source/drains 515 are at relatively high voltages, such as during an erase operation on array of memory cells 104, a voltage, sufficient to activate (e.g., turn on) field-effect transistor 335, may be selectively applied to control gate 545 of field-effect transistor 335, thereby electrically connecting nodes 322. Alternatively, control gate 545 may be selectively allowed to float so that the relatively high voltages on source/drains 515 can act to pull up field-effect transistor 335 to a voltage sufficient to activate (e.g., turn on) field-effect transistor 335, thereby electrically connecting nodes 322.

When a source/drain 515 is at relatively low voltage, such as during a write or read operation on an array of memory cells, control gate 545 of field-effect transistor 335 may be selectively grounded or otherwise biased so that field-effect transistor 335 is deactivated (e.g., turned off), thereby electrically isolating nodes 322 from each other. As such, field-effect transistor 335 may be said to selectively connect nodes 322 to each other. For example, adjacent nodes 322 on either side of field-effect transistor 335 (e.g., in the vertical, horizontal, and/or diagonal directions in frame of reference of FIG. 3) may be at different voltages during a write or read operation, and isolating these nodes 322 from each other using field-effect transistor 335 may act to prevent the voltage on one of the nodes from affecting the voltage on the other node.

During fabrication of the circuit protection device 300, various processing may have a tendency to cause charge accumulation within certain materials. For example, planarization and/or etching processes, e.g., plasma etching processes, may generate such charge. Where sufficient charge has accumulated, a discharge event may occur through a dielectric material. Such discharge events may damage the dielectric material through which the discharge occurred and/or the surrounding semiconductor or conductor materials. For example, a discharge event may occur between a portion of what might become a control gate of a future transistor and a semiconductor upon which the future transistor is to be formed, with the resulting discharge occurring through a dielectric that might become the gate dielectric of that future transistor. This damage might hinder or preclude operation of the future transistor as designed. Various embodiments seek to provide a preferential discharge path away from active circuit elements of the circuit protection device.

FIGS. 7A-7L illustrate a cross section of a portion of a circuit-protection device, such as depicted in FIG. 4, at various stages of fabrication, according to an embodiment. FIGS. 7A-7L may represent partial formation of the circuit-protection device corresponding to one circuit-protection unit 310 of one row 312 of the circuit-protection device. It is noted that those while FIGS. 7A-7L depict rectangular structures, those familiar with integrated circuit fabrication will recognize that such features are generally not as rigidly defined. Accordingly, FIGS. 7A-7L are utilized to discuss the stages of fabrication, but are not intended to define profiles or relative dimensions of any of the structures discussed.

Figure 7A:
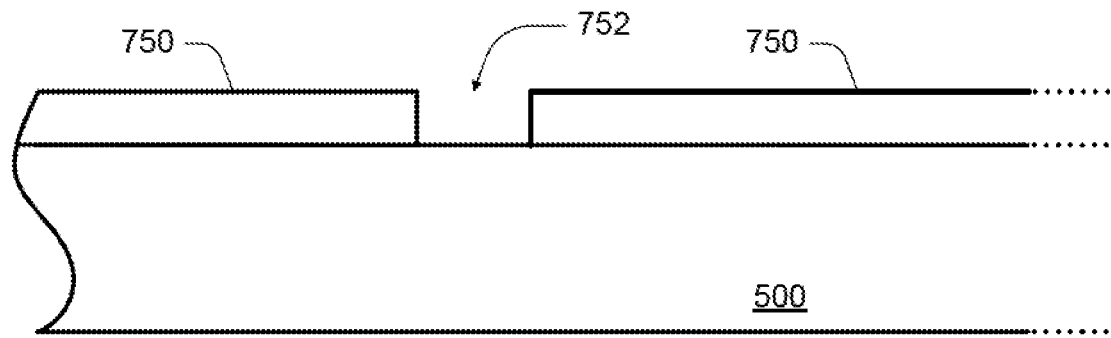
FIGS. 7A-7L illustrate a cross section of a portion of a circuit-protection device, such as depicted in FIG. 4, at various stages of fabrication, according to an embodiment.

In FIG. 7A, a patterned mask 750 might be formed over a semiconductor 500. The semiconductor 500 may comprise silicon, such as monocrystalline silicon, or other semiconductor material. For a further embodiment, semiconductor 500 may be a conductively-doped monocrystalline silicon. Other embodiments may include amorphous silicon, polysilicon or other semiconductor materials. Semiconductor 500 may be conductively doped to a first conductivity type, e.g., a p-type conductivity. The patterned mask 750 may include a nitride (e.g., silicon nitride) mask, such as might be formed using typical photolithographic techniques. The mask 750 may define an opening 752 exposing a portion of the semiconductor 500.

Figure 7B:
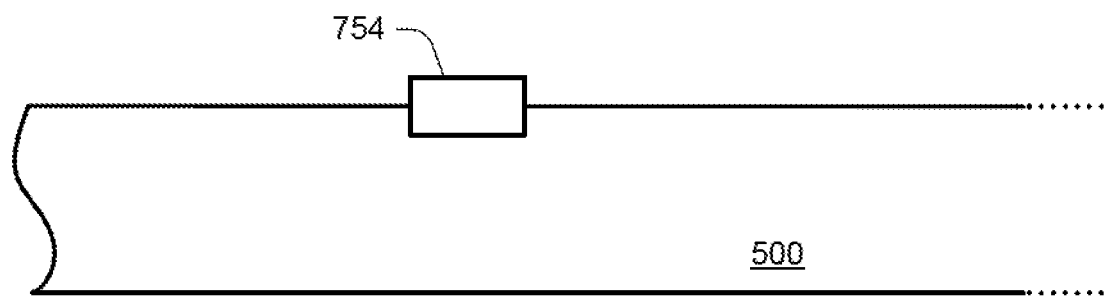

In FIG. 7B, a first dielectric 754 might be formed. The dielectric 754 might be formed by subjecting the exposed portion of the semiconductor 500 of FIG. 7A to a thermal oxidation process, followed by removal of the mask 750. For embodiments where the semiconductor 500 is a silicon material, the dielectric 754 might be a silicon oxide.

Figure 7C:
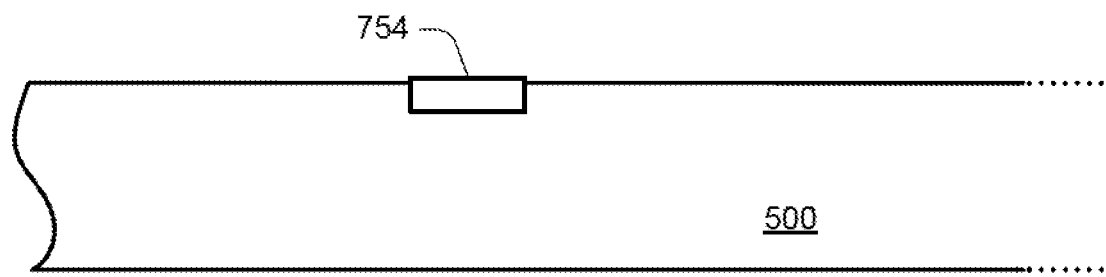

The dielectric 754 may have a thickness greater than a desired thickness. For example, during a thermal oxidation, where it might be desired to form a portion of the dielectric 754 at a particular depth below a surface of the semiconductor, the thermal oxidation may be performed until such a depth is attained. Where the resulting thickness of the dielectric 754 is greater than an interim desired thickness, a portion of the dielectric 754 might be removed, as depicted in FIG. 7C. Such removal might include an etching process, such as a wet etch.

Figure 7D:
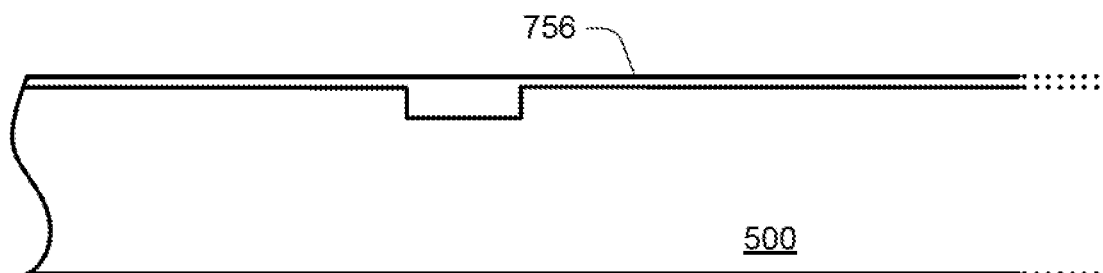

In FIG. 7D, a second dielectric 756 might be formed. The dielectric 756 might be formed by subjecting the semiconductor 500 of FIG. 7B to a thermal oxidation process. The dielectric 756 of FIG. 7D might include, and grow, the dielectric 754 of FIG. 7C. The dielectric 756 might have two nominal thicknesses at this stage, e.g., a first thickness formed in a portion of the semiconductor 500 corresponding to the exposed portion of the semiconductor 500 of FIG. 7A, and a second thickness, less than the first thickness, formed in remaining portions of the semiconductor 500.

Figure 7E:
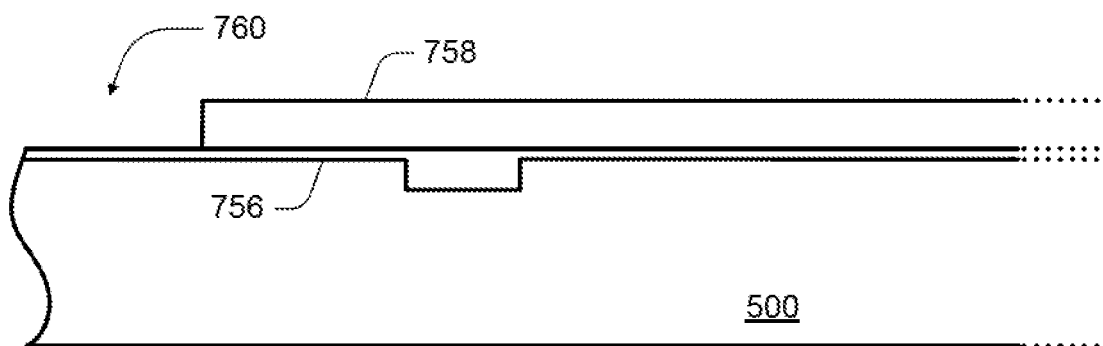

In FIG. 7E, a patterned mask 758 might be formed. The patterned mask 758 may include a photoresist mask, such as might be formed using typical photolithographic techniques. The mask 758 may define an opening 760 exposing a portion of the second dielectric 756, e.g., a portion of the second dielectric 756 having the second thickness.

Figure 7F:
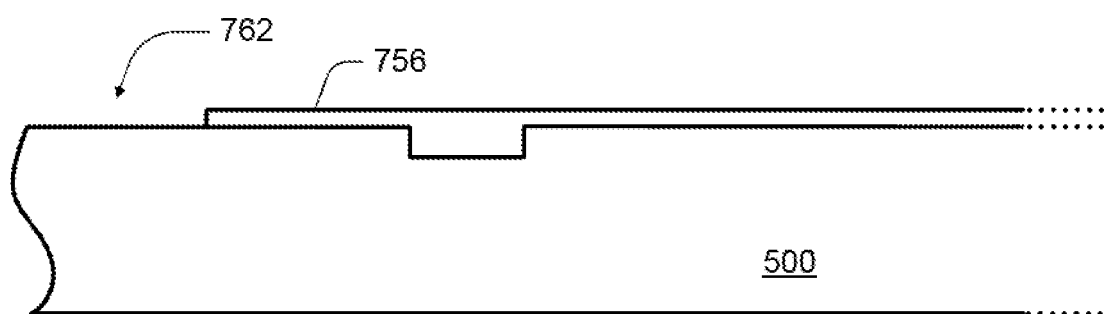

In FIG. 7F, the exposed portion of the second dielectric 756 of FIG. 7E might be removed, exposing a portion 762 of the semiconductor 500 in FIG. 7F. Such removal might include an etching process, such as a wet etch.

Figure 7G:
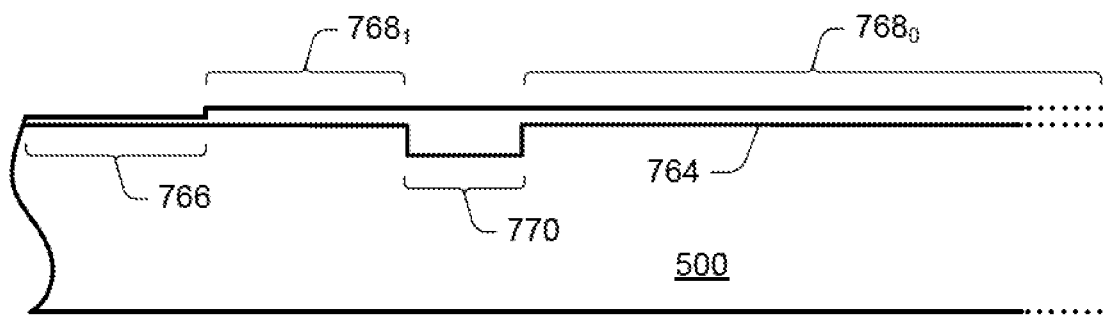

In FIG. 7G, a third dielectric 764 might be formed. The dielectric 764 might be formed by subjecting the semiconductor 500 of FIG. 7F to a thermal oxidation process. The dielectric 764 of FIG. 7G might include, and grow, the dielectric 756 of FIG. 7F. The dielectric 764 might have three nominal thicknesses at this stage, e.g., a first thickness formed in a portion 770 of the semiconductor 500 (e.g., corresponding to the exposed portion of the semiconductor 500 of FIG. 7A); a second thickness, less than the first thickness, formed in portions 768 (e.g., portions $768_0$ and $768_1$) of the semiconductor 500 (e.g., corresponding to portions of the semiconductor 500 not exposed in FIG. 7F other than the portion corresponding to the exposed portion of the semiconductor 500 of FIG. 7A); and a third thickness, less than the second thickness, formed in a portion 766 of the semiconductor 500 (e.g., corresponding to the exposed portion of the semiconductor 500 of FIG. 7F). The dielectric 764 may be contiguous over portions 766, 768 and 770 of the semiconductor 500.

For some embodiments, the third thickness is less than 0.8 times the second thickness. For further embodiments, the third thickness is less than 0.6 times the second thickness. For still further embodiments, the third thickness is less than 0.45 times the second thickness. As one example, the first thickness of the dielectric 764 might be approximately 390 Å and might correspond to an area of the dielectric 764 used to form the gate dielectric 520 of FIG. 4, the second thickness of the dielectric 764 might be approximately 68 Å and might correspond to an area of the dielectric 764 used to form the gate dielectric 540 of FIG. 4, and the third thickness of the dielectric 764 might be approximately 28-38 Å and might correspond to an area of the dielectric 764 that is not used to form any active device.

Figure 7H:
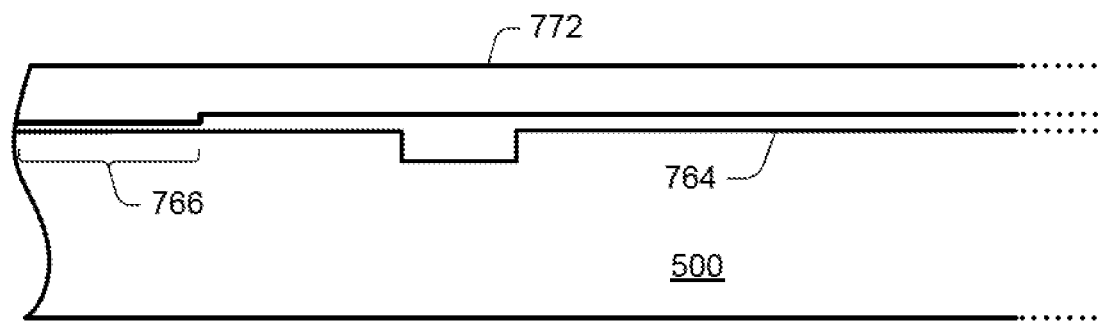

In FIG. 7H, a conductor 772 might be formed over the third dielectric 764. The conductor 772 might include one or more layers of conductive material. For example, the conductor 772 may comprise polysilicon. A conductor 772 comprising polysilicon might be conductively doped during or subsequent to formation.

Figure 7I:
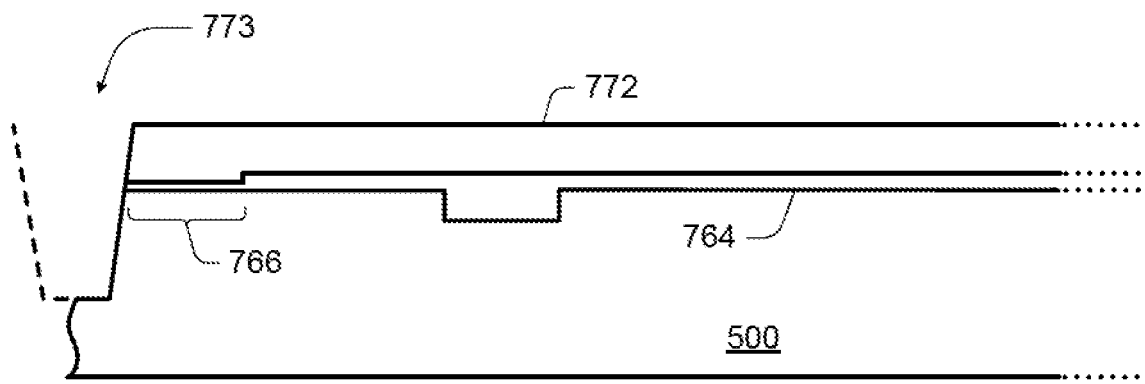
Figure 7J:
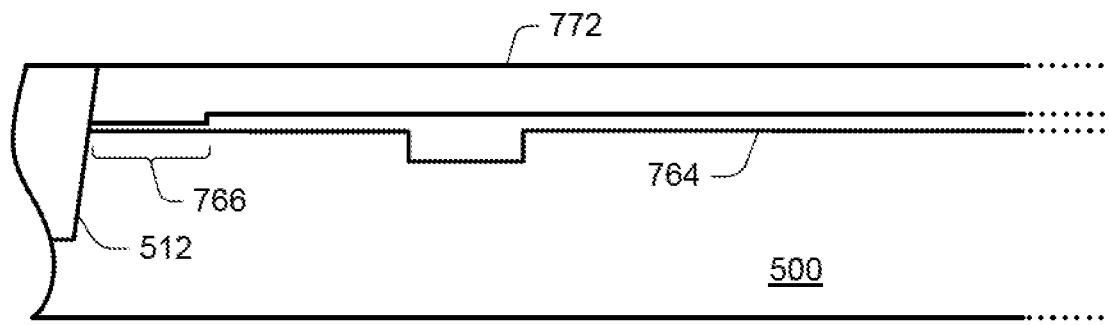

In FIG. 7I, a trench 773 might be formed. The trench 773 might extend through the conductor 772 and the dielectric 764 into the semiconductor 500. In FIG. 7J, the trench 773 of FIG. 7I might be filled with a dielectric, forming isolation region 512. For example, filling the trench 773 might a high-density plasma (HDP) deposition and/or spin-on dielectric (SOD) process. An etch process or chemical-mechanical planarization (CMP) might be used to remove excess dielectric. For example, a CMP process might be used to remove excess dielectric, using the conductor 772 as a stop layer. Such CMP processes may be prone to developing charge build-up in the conductor 772. This charge build-up might cause a breakdown of the dielectric 764 between the conductor 772 and the semiconductor 500. However, as the portion of the dielectric 764 formed in portion 766 of the semiconductor 500 is thinner than other portions of the dielectric 764, any discharge might be expected to occur in this portion 766. Furthermore, as the portion 766 might correspond to an area of the source/drain 510 of FIG. 4 separated from any active device, e.g., the field-effect transistor 310, any resulting damage might be expected to have little or no effect upon the performance of the resulting circuit-protection device.

Figure 7K:
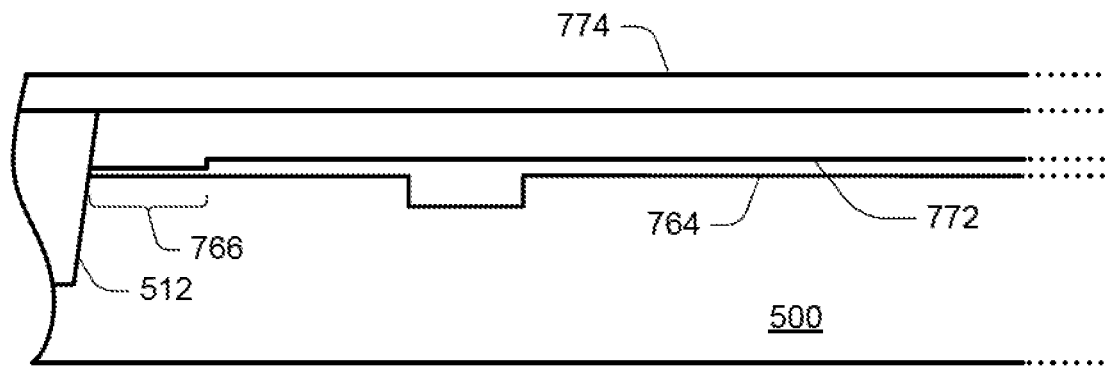
Figure 7L:
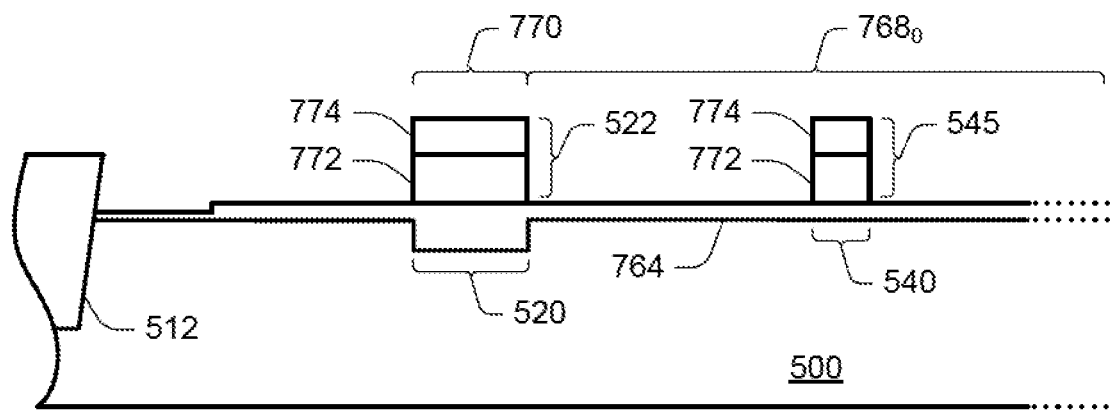

In FIG. 7K, a second conductor 774 might be formed over the first conductor 772 and the isolation region 512. The conductor 774 might include one or more layers of conductive material. For example, the conductor 774 may comprise a metal-containing conductive material, such as tungsten silicide. Subsequent processing might include patterning the conductors 772 and 774 to define control gates for future field-effect transistors. For example, with reference to FIG. 7L, the patterning of the conductors 772 and 774 might retain a portion of the conductor 772 and a portion of the conductor 774 over the portion $768_0$ of the semiconductor 500, which might define a control gate 545 of a future field-effect transistor 335 over a corresponding portion of the dielectric 764 corresponding to the gate dielectric 540 of the future field-effect transistor 335. The patterning of the conductors 772 and 774 might further retain a portion of the conductor 772 and a portion of the conductor 774 over the portion 770 of the semiconductor 500, which might define a control gate 522 of a future field-effect transistor 310 over a corresponding portion of the dielectric 764 corresponding to the gate dielectric 520 of the future field-effect transistor 310.

The patterning of the conductors 772 and 774 might further retain substantially no portion of the conductor 772 or the conductor 774 over the portion 766 of the semiconductor 500. For example, each portion of the dielectric 764 having the third (e.g., thinnest) thickness might be removed. Note that removal, as used herein, does not require complete removal as typical industrial processing may leave trace amounts even when complete removal is desired. However, such removal of the conductors 772 and 774 herein involves removing sufficient amounts of the conductors 772 and 774 that they no longer function as a contiguous conductor between active circuit elements over the portion 766 of the semiconductor 500.

Patterning of the conductors 772 and 774 might involve a patterned etch process, which might include a plasma etch process. Charge build-up that might occur during the etch process might be discharged through the dielectric 764 having the third thickness before complete removal of the conductor 772, for example. Subsequent to removal of the conductor 772, the dielectric 764 having the third thickness may no longer provide a preferential discharge path. However, the risk of subsequent discharge at this stage of processing might be deemed to be inconsequential, or otherwise mitigated by other mechanisms.

Further processing may occur previously or subsequently in manners understood in the art. For example, various conductive implants might be performed to define source/drains, contact areas, or Vt characteristics for the resulting field-effect transistors. Furthermore, dielectric caps and spacers, as well as conductive contacts, might also be formed in manners understood in the art. Subsequent processing may remove portions of the dielectric 764 exposed in FIG. 7L, e.g., including the portion of the dielectric 764 having the third (e.g., thinnest) thickness over the portion 766 of the semiconductor 500. However, it is expected that this portion of the dielectric 764 over the portion 766 of the semiconductor 500 would not experience further discharge events even if it were to be retained during the subsequent processing.

It is noted that a mirror image of the FIGS. 7A-7L might also represent partial formation of the circuit-protection device corresponding to the other circuit-protection unit 310 of the row 314 of the circuit-protection device. Alternatively, a mirror image of the FIGS. 7A-7L might represent partial formation of the circuit-protection device corresponding to the other circuit-protection unit 310 of the row 314 of the circuit-protection device with the exceptions that the patterned mask 758 of FIG. 7E would not expose the dielectric 756, and the trench 773 would be formed through the dielectric 764 in the portion 768 (e.g., $768_1$) of the semiconductor 500, such that there need be no portion 766 of the semiconductor 500 for formation of the circuit-protection unit 310 of the row 314 of the circuit-protection device.

Figure 8:
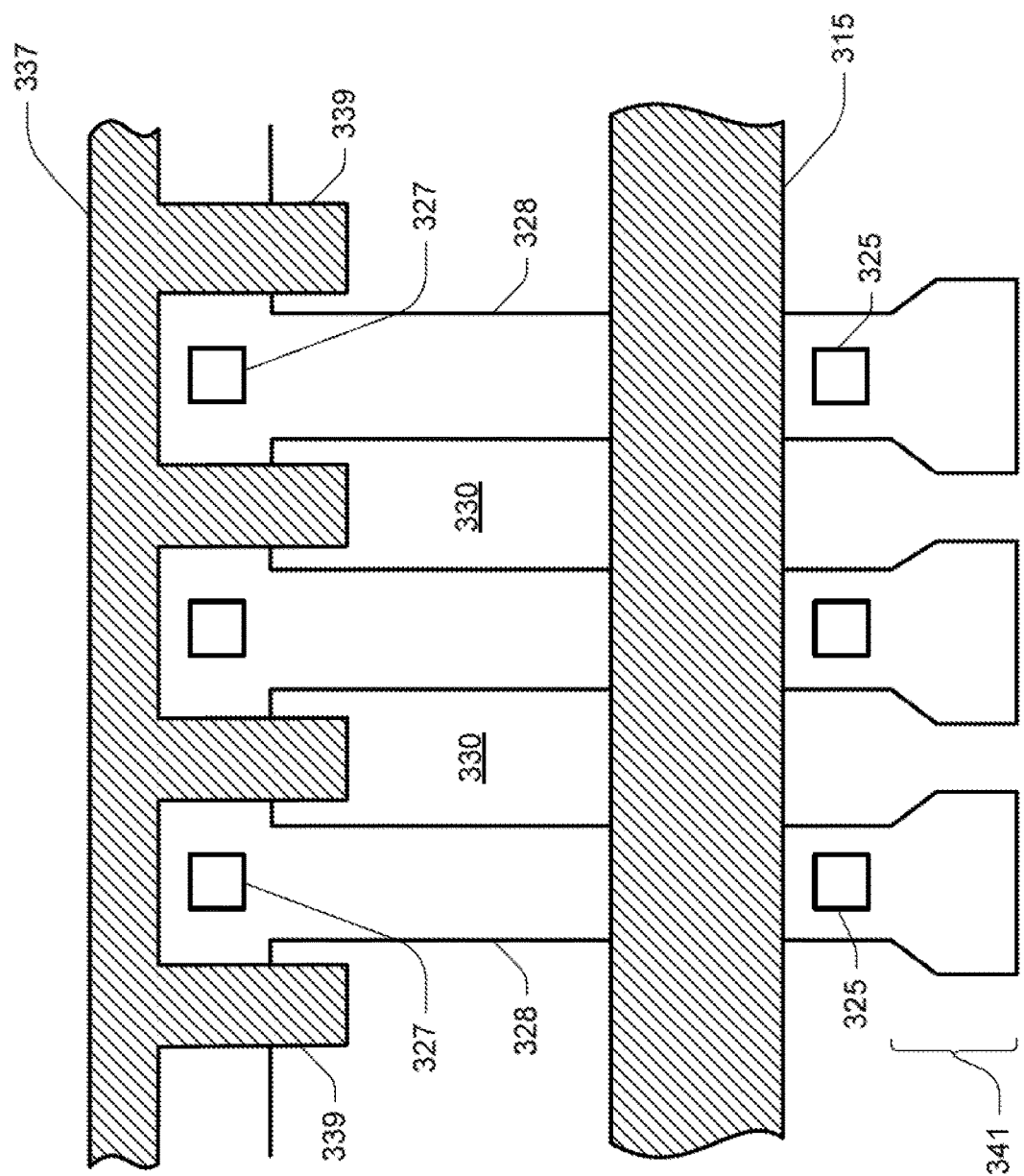
FIG. 8 is a top plan view of a circuit-protection device, according to another embodiment.

FIG. 8 is a top plan view of a circuit-protection device, according to another embodiment. In the embodiment depicted in FIG. 8, the active regions 328 are depicted to have a different (e.g., greater) width in a portion corresponding to the extension region 341. Increasing the width of the active regions 328 for the extension region 341 may facilitate reducing the length of the extension region 341 without sacrificing resulting area. As this portion of the circuit-protection device is expected to experience low voltage operation, the isolation distance between adjacent active regions 328 at the extension regions 341 might be reduced relative to the isolation distance between the adjacent active regions 328 near the contacts 327, e.g., between the spurs 339. It is believed that the area of an extension region 341 (e.g., a portion of the active region 328 corresponding to the portion 766 of the semiconductor 500 having the third (e.g., thinnest) thickness of the dielectric 764), may be more determinative of its ability to provide a preferential discharge path than its length. By reducing the length, spacing between adjacent circuit-protection devices 300 might be reduced.

Figure 9:
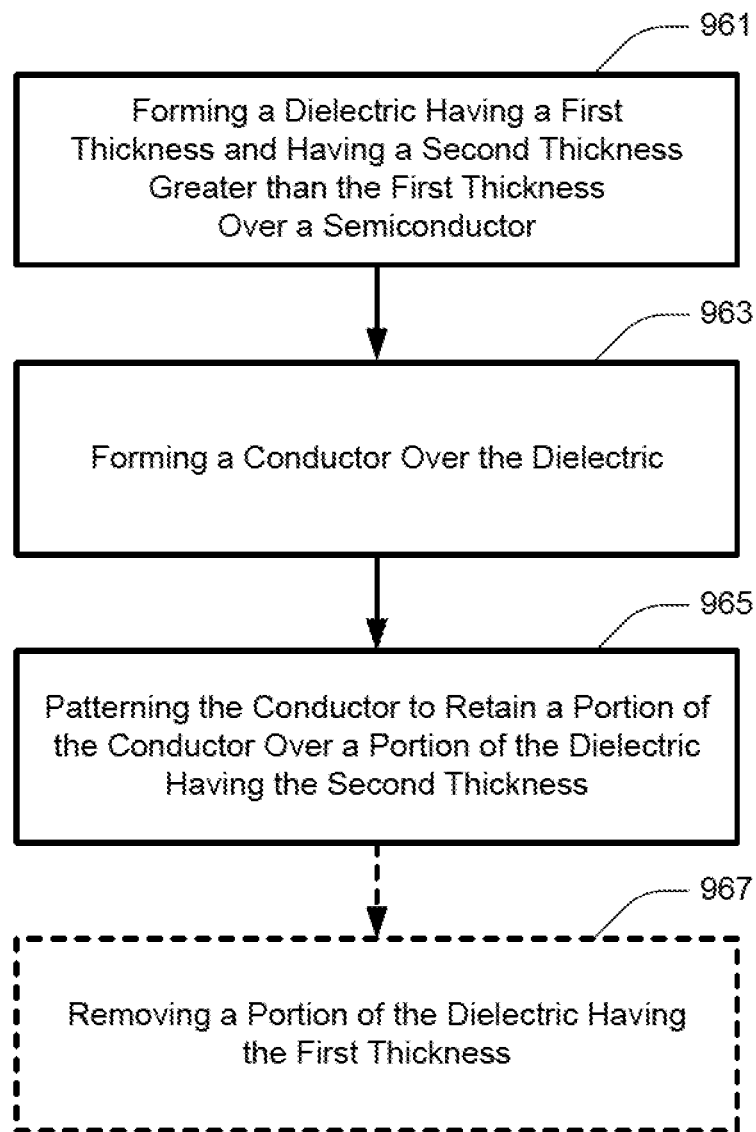
FIG. 9 is a flowchart of a method of fabricating a circuit-protection device, according to an embodiment.

FIG. 9 is a flowchart of a method of fabricating a circuit-protection device, according to an embodiment. At 961, a dielectric having a first thickness and having a second thickness, greater than the first thickness, is formed over a semiconductor. For example, with reference to FIG. 7G, the dielectric 764 is formed over the semiconductor 500. The first thickness of 961 might refer to the thickness of the dielectric 764 over the portion 766 of the semiconductor 500, while the second thickness of 961 might refer to the thickness of the dielectric 764 over the portion $768_0$ of the semiconductor 500.

At 963, a conductor is formed over the dielectric. For example, with reference to FIG. 7H, the conductor 772 might be formed over the dielectric 764. In addition, the conductor of 963 might further include the conductor 774 described with reference to FIG. 7K.

At 965, the conductor is patterned to retain a portion of the conductor over a portion of the dielectric having the second thickness. For example, with reference to FIG. 7L, a portion of the conductor 772 (e.g., and conductor 774) is retained over a portion of the dielectric 764 having the thickness corresponding to the portion 768 (e.g., $768_0$) of the semiconductor 500. The patterning of the conductor might further retain substantially no portion of the conductor over the portion of the dielectric having the first thickness.

At 967, a portion of the dielectric having the first thickness might optionally be removed. For example, in subsequent processing from FIG. 7L, the dielectric cap 534 and spacers 532 of FIG. 4 might be formed. Such formation might include a blanket deposition of a dielectric for the spacers 532 followed by an anisotropic removal process (e.g., etch) to leave the spacers 532. This might further remove the portions of the dielectric 764 exposed in FIG. 7L, such as might be shown in FIG. 4.

It will be apparent that the method described with reference to the flowchart of FIG. 9 may be extended to describe fabrication of opposing circuit-protection units of the circuit-protection device, e.g., with only one circuit-protection unit utilizing the first thickness of the dielectric.

Figure 10:
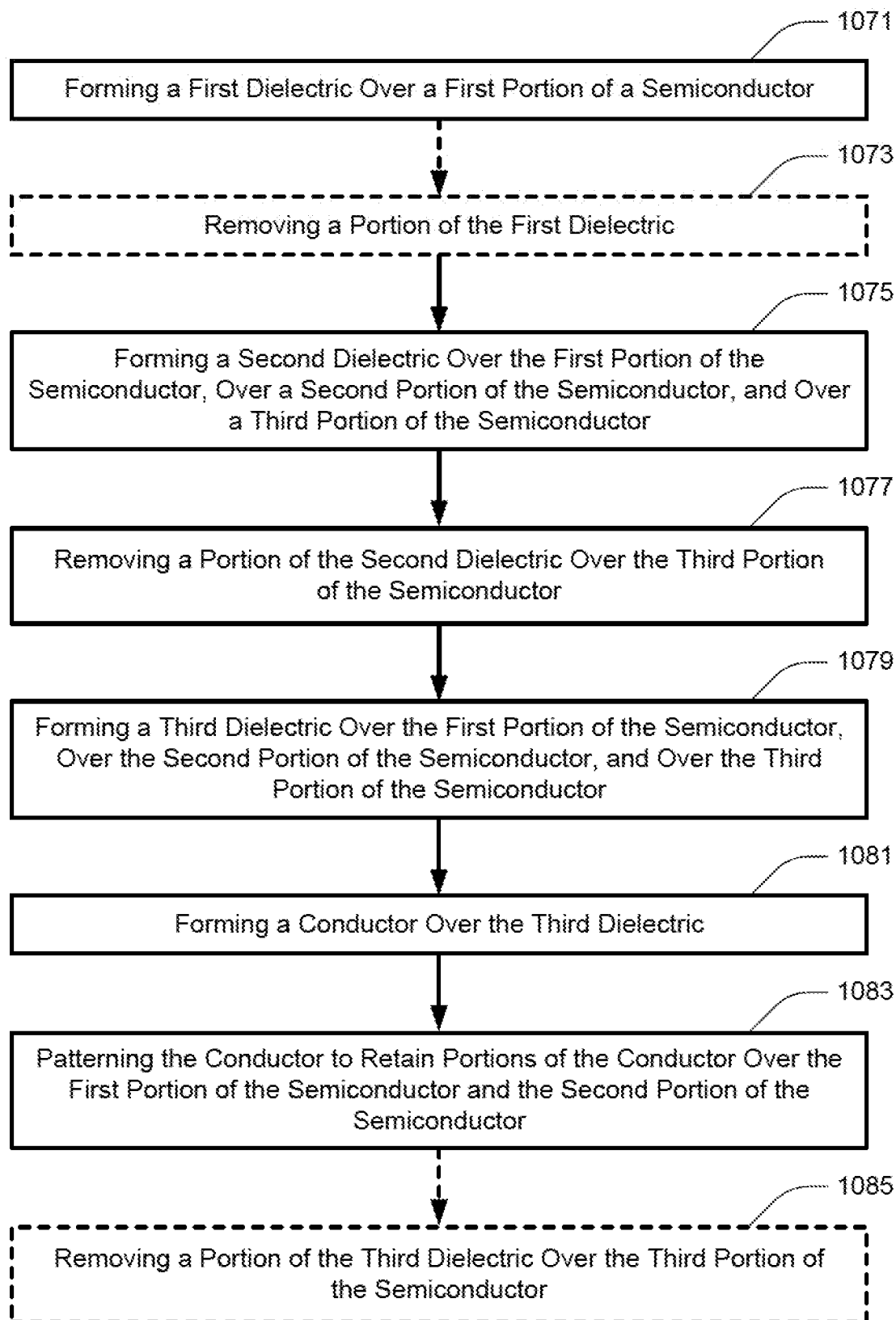
FIG. 10 is a flowchart of a method of fabricating a circuit-protection device, according to a further embodiment.

FIG. 10 is a flowchart of a method of fabricating a circuit-protection device, according to a further embodiment. At 1071, a first dielectric might be formed over a first portion of a semiconductor. For example, with reference to FIGS. 7A-7B, the dielectric 754 is formed over the semiconductor 500 over a portion of the semiconductor 500 corresponding to the portion of the semiconductor 500 exposed in FIG. 7A. At 1073, a portion of the first dielectric might optionally be removed.

At 1075, a second dielectric might be formed over the first portion of the semiconductor, over a second portion of the semiconductor, and over a third portion of the semiconductor. For example, with reference to FIGS. 7D and 7G, the dielectric 756 is formed over portions of the semiconductor 500 corresponding to portions 770, 768 and 766, which might correspond to the first portion, second portion and third portion, respectively, of 1075. The second dielectric might include, and further grow, the first dielectric.

At 1077, a portion of the second semiconductor over the third portion of the semiconductor might be removed. For example, with reference to FIGS. 7E-7F, the portion of the dielectric 756 exposed by the opening 760 of mask 758 might be removed to expose a portion 762 of the semiconductor 500.

At 1079, a third dielectric might be formed over the first portion of the semiconductor, over the second portion of the semiconductor, and over the third portion of the semiconductor. For example, with reference to FIG. 7G, the dielectric 764 is formed over portions of the semiconductor 500 corresponding to portions 770, 768 and 766. The second dielectric might include, and further grow, the second dielectric.

At 1081, a conductor is formed over the third dielectric. For example, with reference to FIG. 7H, the conductor 772 might be formed over the dielectric 764. In addition, the conductor of 1081 might further include the conductor 774 described with reference to FIG. 7K.

At 1083, the conductor is patterned to retain portions of the conductor over the first portion of the semiconductor and over the second portion of the semiconductor. For example, with reference to FIG. 7L, a portion of the conductor 772 (e.g., and conductor 774) is retained over a portion 770 of the semiconductor 500, and a portion of the conductor 772 (e.g., and conductor 774) is retained over a portion 768 (e.g., $768_0$) of the semiconductor 500. The patterning of the conductor might further retain substantially no portion of the conductor over the third portion of the semiconductor.

At 1085, a portion (e.g., an entire portion) of the third dielectric over the third portion of the semiconductor might optionally be removed. For example, in subsequent processing from FIG. 7L, the dielectric cap 534 and spacers 532 of FIG. 4 might be formed. Such formation might include a blanket deposition of a dielectric for the spacers 532 followed by an anisotropic removal process (e.g., etch) to leave the spacers 532. This might further remove the portions of the dielectric 764 exposed in FIG. 7L, such as might be shown in FIG. 4.

It will be apparent that the method described with reference to the flowchart of FIG. 10 may be extended to describe fabrication of opposing circuit-protection units of the circuit-protection device, e.g., with only one of the circuit-protection units utilizing the dielectric over the third portion of the semiconductor.

CONCLUSION

Although specific embodiments have been illustrated and described herein, it will be appreciated by those of ordinary skill in the art that any arrangement that is calculated to achieve a similar (e.g., the same) purpose may be substituted for the specific embodiments shown. Accordingly, this application is intended to cover any adaptations or variations of the embodiments.

What is claimed is:

1. An apparatus, comprising:
an array of memory cells;
a plurality of data lines, each data line of the plurality of data lines connected to a respective set of memory cells of the array of memory cells;
peripheral circuitry for access of the array of memory cells;
a first transistor comprising a control gate, a first source/drain connected to the peripheral circuitry through a first contact, and a second source/drain connected to a first data line of the plurality of data lines;
a second transistor comprising a control gate, a first source/drain connected to the peripheral circuitry through a second contact, and a second source/drain connected to a second data line of the plurality of data lines;
a third transistor comprising a control gate, a first source/drain connected to the second source/drain of the first transistor, and a second source/drain connected to a source of the array of memory cells; and
a fourth transistor comprising a control gate, a first source/drain connected to the second source/drain of the second transistor, and a second source/drain connected to the second source/drain of the third transistor;
wherein the first contact is between a first isolation region and the first source/drain of the first transistor;
wherein the second contact is between a second isolation region and the first source/drain of the second transistor; and
wherein a distance between the first contact and the first isolation region is greater than a distance between the second contact and the second isolation region.

2. The apparatus of claim 1, wherein the distance between the first contact and the first isolation region is greater than two times the distance between the second contact and the second isolation region.

3. The apparatus of claim 1, wherein the first transistor, second transistor, third transistor and fourth transistor are each formed over a semiconductor, wherein the first transistor, second transistor, third transistor and fourth transistor each further comprise a respective gate dielectric between the semiconductor and their respective control gate, wherein the gate dielectric of the first transistor has a thickness greater than a thickness of the gate dielectric of the third transistor, and wherein the gate dielectric of the second transistor has a thickness greater than a thickness of the gate dielectric of the fourth transistor.

4. The apparatus of claim 3, wherein the thickness of the gate dielectric of the first transistor is equal to the thickness of the gate dielectric of the second transistor.

5. The apparatus of claim 3, wherein the thickness of the gate dielectric of the third transistor is equal to the thickness of the gate dielectric of the fourth transistor.

6. An apparatus, comprising:
an array of memory cells;
a plurality of data lines, each data line of the plurality of data lines connected to a respective set of memory cells of the array of memory cells;
peripheral circuitry for access of the array of memory cells;
a first transistor comprising a gate dielectric overlying a semiconductor, a control gate overlying the gate dielectric, a first source/drain in the semiconductor and connected to the peripheral circuitry through a first contact, and a second source/drain in the semiconductor connected to a first data line of the plurality of data lines;
a second transistor comprising a gate dielectric overlying the semiconductor, a control gate overlying the gate dielectric, a first source/drain in the semiconductor and connected to the peripheral circuitry through a second contact, and a second source/drain in the semiconductor connected to a second data line of the plurality of data lines;
a third transistor comprising a gate dielectric overlying the semiconductor, a control gate overlying the gate dielectric, a first source/drain in the semiconductor and connected to the second source/drain of the first transistor, and a second source/drain in the semiconductor and connected to a source of the array of memory cells; and
a fourth transistor comprising a gate dielectric overlying the semiconductor, a control gate overlying the gate dielectric, a first source/drain in the semiconductor and connected to the second source/drain of the second transistor, and a second source/drain in the semiconductor and connected to the second source/drain of the third transistor;
wherein the first contact is between a first isolation region and the first transistor;
wherein the second contact is between a second isolation region and the second transistor; and
wherein a distance between the first contact and the first isolation region is greater than a distance between the second contact and the second isolation region.

7. The apparatus of claim 6, wherein the first source/drain of the first transistor abuts the first isolation region, and wherein the first source/drain of the second transistor abuts the second isolation region.

8. The apparatus of claim 6, wherein a thickness of the gate dielectric of the first transistor is greater than a thickness of the gate dielectric of the third transistor.

9. The apparatus of claim 8, wherein the thickness of the gate dielectric of the first transistor is greater than five times the thickness of the gate dielectric of the third transistor.

10. The apparatus of claim 8, wherein a thickness of the gate dielectric of the second transistor is equal to the thickness of the gate dielectric of the first transistor, and wherein a thickness of the gate dielectric of the fourth transistor is equal to the thickness of the gate dielectric of the third transistor.

11. The apparatus of claim 6, wherein the distance between the first contact and the first isolation region is greater than two times the distance between the second contact and the second isolation region.

12. The apparatus of claim 11, wherein the distance between the first contact and the first isolation region is greater than three times the distance between the second contact and the second isolation region.

13. An apparatus, comprising:
an array of memory cells;
a plurality of data lines, each data line of the plurality of data lines connected to a respective set of memory cells of the array of memory cells;
peripheral circuitry for access of the array of memory cells;
a first transistor formed overlying a first active region and comprising a control gate, a first source/drain connected to the peripheral circuitry through a first contact, and a second source/drain connected to a first data line of the plurality of data lines;
a second transistor formed overlying a second active region and comprising a control gate, a first source/drain connected to the peripheral circuitry through a second contact, and a second source/drain connected to a second data line of the plurality of data lines;
a third transistor formed overlying a third active region and comprising a control gate, a first source/drain connected to the second source/drain of the first transistor, and a second source/drain connected to a source of the array of memory cells;
a fourth transistor formed overlying the third active region and comprising a control gate, a first source/drain connected to the second source/drain of the second transistor, and a second source/drain connected to the second source/drain of the third transistor;
a fifth transistor formed overlying a fourth active region and comprising a control gate connected to the control gate of the first transistor, a first source/drain connected to the peripheral circuitry through a third contact, and a second source/drain connected to a third data line of the plurality of data lines;
a sixth transistor formed overlying a fifth active region and comprising a control gate connected to the control gate of the second transistor, a first source/drain connected to the peripheral circuitry through a fourth contact, and a second source/drain connected to a fourth data line of the plurality of data lines;
a seventh transistor formed overlying the third active region and comprising a control gate a control gate connected to the control gate of the third transistor, a first source/drain connected to the second source/drain of the fifth transistor, and a second source/drain connected to a source of the array of memory cells; and
an eighth transistor formed overlying the third active region and comprising a control gate a control gate connected to the control gate of the fourth transistor, a first source/drain connected to the second source/drain of the sixth transistor, and a second source/drain connected to the second source/drain of the seventh transistor;

wherein the first contact is between a first isolation region and the first transistor;

wherein the second contact is between a second isolation region and the second transistor;

wherein the third contact is between the first isolation region and the fifth transistor;

wherein the fourth contact is between the second isolation region and the sixth transistor;

wherein a distance between the first contact and the first isolation region is greater than a distance between the second contact and the second isolation region; and wherein a distance between the third contact and the first isolation region is greater than a distance between the fourth contact and the second isolation region.

14. The apparatus of claim 13, wherein the distance between the first contact and the first isolation region is equal to the distance between the third contact and the first isolation region, and wherein the distance between the second contact and the second isolation region is equal to the distance between the fourth contact and the second isolation region.

15. The apparatus of claim 13, further comprising a third isolation region between the first active region and the fourth active region, and a fourth isolation region between the second active region and the fifth active region.

16. The apparatus of claim 15, wherein the third isolation region is contiguous with the first isolation region, and wherein the fourth isolation region is contiguous with the second isolation region.

17. The apparatus of claim 15, further comprising:

a first control line extending over the first active region, the third isolation region and the fourth active region, wherein the first control line is connected to the control gate of the first transistor and to the control gate of the fifth transistor;

a second control line extending over the second active region, the fourth isolation region and the fifth active region, wherein the second control line is connected to the control gate of the second transistor and to the control gate of the sixth transistor;

a third control line extending over the third active region, wherein the third control line is connected to the control gate of the third transistor and to the control gate of the seventh transistor; and a fourth control line extending over the third active region, wherein the fourth control line is connected to the control gate of the fourth transistor and to the control gate of the eighth transistor.

18. The apparatus of claim 17, wherein the third control line comprises a first conductive spur extending from the third control line and the fourth control line comprises a second conductive spur extending from the fourth control line, wherein a portion of the first conductive spur extends over a portion of the third isolation region, and wherein a portion of the second conductive spur extends over a portion of the fourth isolation region.

19. The apparatus of claim 18, wherein first conductive spur is isolated from the first control line, and wherein second conductive spur is isolated from the second control line.

20. The apparatus of claim 17, wherein the first control line, the second control line, the third control line and the fourth control line are formed concurrently using a same conductive material.

\* \* \* \* \*